(12) United States Patent
Agarwal et al.

(10) Patent No.: US 11,955,964 B2
(45) Date of Patent: Apr. 9, 2024

(54) MULTI-CHANNEL MULTIPLEXER

(71) Applicant: TEXAS INSTRUMENTS INCORPORATED, Dallas, TX (US)

(72) Inventors: Nitin Agarwal, Bengaluru (IN); Kunal Suresh Karanjkar, Bengaluru (IN); Venkata Ramanan R, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/169,638

(22) Filed: Feb. 8, 2021

(65) Prior Publication Data

US 2021/0167775 A1 Jun. 3, 2021

Related U.S. Application Data

(63) Continuation of application No. 16/700,444, filed on Dec. 2, 2019, now Pat. No. 10,917,090.

(51) Int. Cl.
*H03K 17/693* (2006.01)
*H03F 3/72* (2006.01)
*H03K 17/00* (2006.01)
*H03K 17/10* (2006.01)

(52) U.S. Cl.
CPC .......... *H03K 17/693* (2013.01); *H03F 3/72* (2013.01); *H03K 17/005* (2013.01); *H03K 17/102* (2013.01)

(58) Field of Classification Search
None
See application file for complete search history.

(56) References Cited

U.S. PATENT DOCUMENTS

| | | | | |
|---|---|---|---|---|
| 5,075,566 A * | 12/1991 | Chuang | .............. | H03K 17/6264 327/482 |
| 5,289,332 A * | 2/1994 | Senn | .................... | G09G 3/3688 307/115 |
| 5,801,673 A * | 9/1998 | Shimada | .............. | G09G 3/3688 345/100 |
| 5,880,620 A | 3/1999 | Gitlin et al. | | |
| 5,910,780 A * | 6/1999 | Tam | .................... | H03K 17/002 361/60 |

(Continued)

FOREIGN PATENT DOCUMENTS

GB 2336488 A 10/1999

OTHER PUBLICATIONS

Extended European Search Report dated Nov. 25, 2022, European Application No. 20896793.5, 12 pages.

*Primary Examiner* — Thomas J. Hiltunen
*Assistant Examiner* — Khareem E Almo
(74) *Attorney, Agent, or Firm* — Brian D. Graham; Frank D. Cimino

(57) ABSTRACT

A circuit includes a first switch assembly having a first input node and a first output node, and a second switch assembly having a second input node and a second output node. The circuit further includes a third switch assembly an operational amplifier, and a buffer. The third switch assembly has a third input node and a third output node. The third input node is coupled to the second output node, and the third output node is coupled to the first output node. The buffer has a buffer input and a buffer output. The buffer input is coupled to an input stage of the operational amplifier. The buffer output is coupled to the third switch assembly.

18 Claims, 5 Drawing Sheets

(56) References Cited

U.S. PATENT DOCUMENTS

| | | | | |
|---|---|---|---|---|
| 6,040,732 A | * | 3/2000 | Brokaw | H03F 3/72 |
| | | | | 327/437 |
| 6,335,653 B1 | * | 1/2002 | Shigehara | H03K 17/063 |
| | | | | 327/404 |
| 6,417,717 B1 | * | 7/2002 | Loinaz | H03F 3/45986 |
| | | | | 327/407 |
| 7,394,309 B1 | | 7/2008 | Potanin et al. | |
| 8,111,094 B2 | * | 2/2012 | Fischer | G11C 27/02 |
| | | | | 327/407 |
| 8,729,954 B2 | | 5/2014 | McAndrew et al. | |
| 9,520,869 B2 | * | 12/2016 | Fiedorow | H03K 17/162 |
| 10,396,792 B2 | * | 8/2019 | Masson | H03K 17/005 |
| 2006/0022741 A1 | * | 2/2006 | Hopkins | H03F 3/211 |
| | | | | 327/407 |
| 2006/0284678 A1 | | 12/2006 | Dillon | |
| 2008/0218266 A1 | | 9/2008 | Kobayashi et al. | |
| 2011/0002062 A1 | | 1/2011 | Fischer et al. | |
| 2012/0161844 A1 | | 6/2012 | Chee et al. | |
| 2012/0188109 A1 | * | 7/2012 | Sanduleanu | H03M 1/1061 |
| | | | | 341/120 |
| 2012/0319762 A1 | | 12/2012 | Watanabe et al. | |
| 2016/0261263 A1 | | 9/2016 | Chen et al. | |
| 2017/0331489 A1 | | 11/2017 | Dempsey et al. | |
| 2019/0260378 A1 | | 8/2019 | Yamamoto | |
| 2019/0317541 A1 | | 10/2019 | Wang et al. | |
| 2020/0077039 A1 | | 3/2020 | Zimmerman et al. | |

\* cited by examiner

MULTI-CHANNEL MULTIPLEXER

CROSS-REFERENCE TO RELATED APPLICATIONS

This application is a continuation of U.S. patent application Ser. No. 16/700,444, filed Dec. 2, 2019, which is incorporated by reference herein in its entirety.

BACKGROUND

Some applications include a sensor processing system and a multiplexer. One or more sensors may be coupled to the multiplexer. The sensors are coupled to the processing system through the multiplexer. The multiplexer includes multiple channels, with each channel potentially coupled to a separate sensor. The processing system processes the signal from one sensor at a time. To receive and process a signal from a given sensor coupled to one of the channels, control signals to the multiplexer enable the channel corresponding to the desired sensor while disabling the remaining channels of the multiplexer.

SUMMARY

In one example, a circuit includes first, second, and third switch assemblies, a buffer, and a bulk biasing circuit. The first switch assembly has a first input node and a first output node. The second switch assembly has a second input node and a second output node. The third switch assembly has a third input node and a third output node. The third input node is coupled to the second output node. The third output node is coupled to the first output node. The third switch assembly includes a first transistor that includes a bulk. The buffer has a buffer input and a buffer output. The buffer input is coupled to the first output node, and the buffer output is coupled to the third switch assembly. The bulk biasing circuit is coupled to the bulk of the first transistor. The bulk biasing circuit is configured to bias the bulk of the first transistor at a first bias voltage responsive to a voltage on the input node being above a first voltage level, and to bias the bulk of the first transistor at a second bias voltage responsive to the voltage on the input node being below a second voltage level.

BRIEF DESCRIPTION OF THE DRAWINGS

For a detailed description of various examples, reference will now be made to the accompanying drawings in which.

DETAILED DESCRIPTION

A multiplexer may include a number of independent channels that pass data from respective inputs to a single output, and, in a sensing application, the multiplexer may pass data from a set of sensors coupled to the inputs to a processor coupled to the output. Control signals from a multiplexer controller enable one of the channels, while those channels corresponding to sensors not intending to be processed by a sensor processing system at a given point in time are disabled. Each channel of the multiplexer comprises solid-state switches (transistors) that are used to enable and disable the channel. When a transistor is "on," current can be conducted through the transistor. When a transistor is "off," the principal conducting pathway (e.g., the channel in a metal oxide semiconductor field effect transistor) is off and generally does not conduct current. However, leakage current may conduct through the transistor when the transistor is off.

In many applications, transistor leakage current is not problematic. In other applications, however, leakage current can be a problem. For example, in the application noted above in which multiple sensors are coupled to a processing system through a multiplexer, even when the transistors are off for a channel that has been disabled, leakage current can still flow through that channel's transistors. If the sensor connected to that channel has a large output impedance, even a small amount of leakage current can cause a significant voltage to develop across the sensor due to the sensor's large output impedance. The voltage undesirably produced in the disabled channel can modify (e.g., add to) the voltage produced by the sensor whose channel is enabled, thereby undesirably altering the sensor signal intended to be processed.

The examples disclosed herein are directed to a multiplexer in which each channel of the multiplexer includes multiple metal oxide semiconductor field effect transistors (MOS transistors). One or more of the multiplexer's channels biases the bulk of at least one of its MOS transistors to reduce the leakage current that might otherwise be present for a low amplitude voltage generated by the sensor on the channel that is enabled. Further, a buffer is provided whose input coupled to the output of the multiplexer. The output of the buffer is coupled to one or more of the multiplexer's channels. When a given channel is off, rather than grounding an internal node of the given channel, the internal node is coupled to the multiplexer's output voltage level via the buffer. As such, the drain-to-source potential difference across a MOS transistor in each 'off' channel is approximately 0 V and thus very little, if any leakage current will flow between the drain and source of the transistor.

Figure 1:
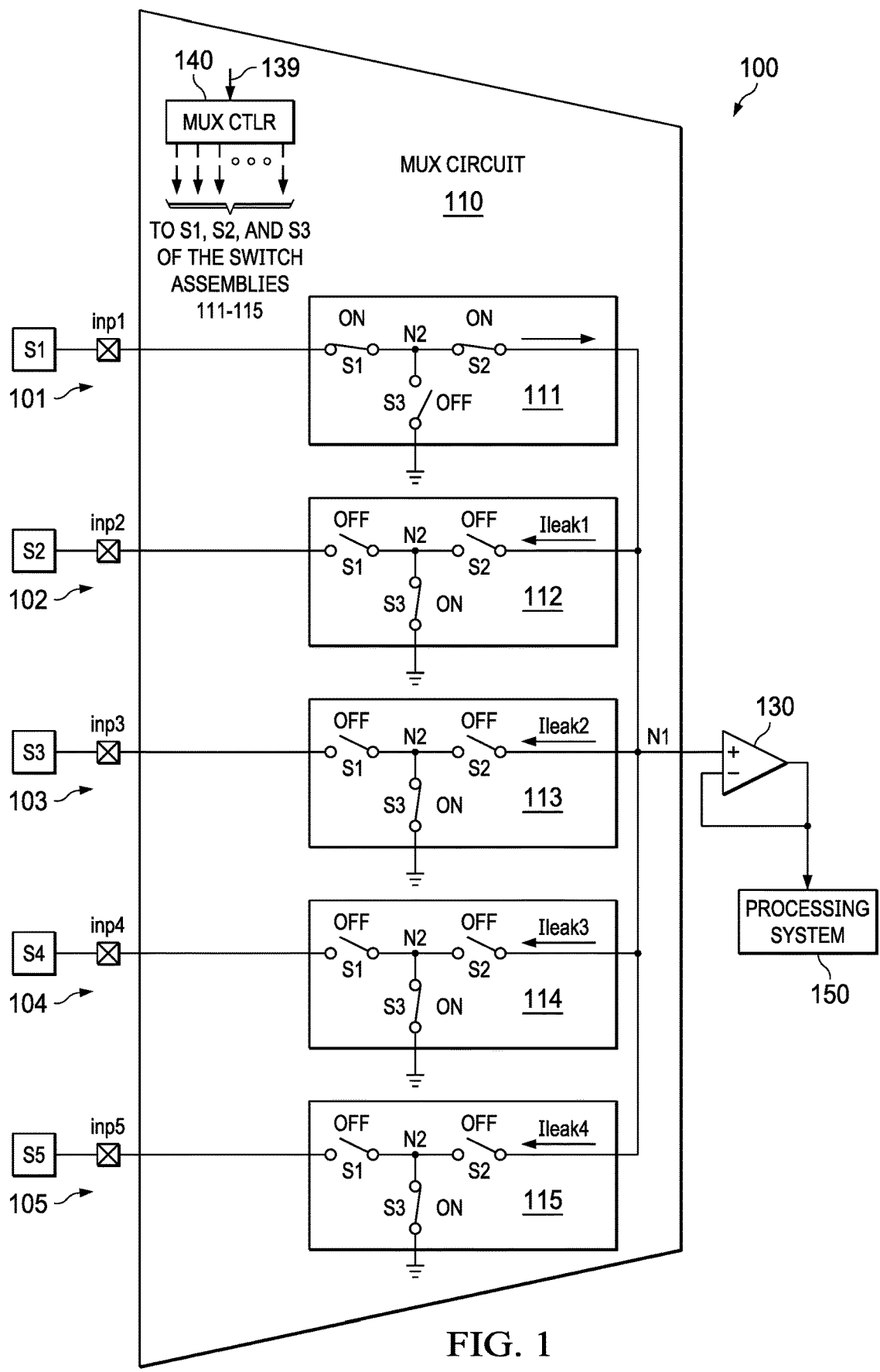
FIG. 1 illustrates an example of a multi-channel system.

FIG. 1 shows an example of a system 100 comprising a multiplexer ("mux") circuit 110 coupled to an operational amplifier ("op amp") 130. The mux circuit 110 comprises multiple channels. In this example, the mux circuit 110 includes five channels shown at 101, 102, 103, 104, and 105. Each channel is coupled to a respective input, and the inputs of channels 101-105 are designated inp1, inp2, inp3, inp4, and inp5, respectively. A device such as a sensor can be connected to each channel input. In this example, five sensors (S1, S2, S3, S4, S5) can be coupled to the op amp 130 through the mux circuit 110. Via control signals from a mux controller 140 (in response to a channel selection signal 139) to the mux circuit 110, one channel at a time is enabled (on), and the remaining four channels are disabled (off). The signal from the sensor whose channel is enabled is provided through the mux circuit 110 to node N1 and thus to the non-inverting (+) input of the op amp 130. The op-amp 130 has its output connected to its inverting (−) input, and thus the op-amp 130 is configured for unity gain. Other configurations of the op-amp (e.g., gain greater than 1) are possible as well. The output from the op-amp 130 is coupled to a processing system 150 to process the op-amp's output signal. The processing system 150 may include a microprocessor, a filter, or other types of processing electronics.

The mux circuit 110 includes a switch assembly for each channel. Channel 101 has switch assembly 111, and channels 102-105 have switch assemblies 112-115, respectively. Input inp1 can be coupled to node N1 when switch assembly 111 is "on". Similarly, any of inputs inp2-inp5 can be coupled to node N1 when their respective switch assemblies 111-115 are on. Node N1 is connected to the op amp's non-inverting input. In this example, only one switch assembly 111-115 is turned on at a time, and the remaining switch assemblies are turned off.

In the example of FIG. 1, each switch assembly 111-115 comprises three switches S1, S2, and S3. S1 and S2 are connected in series between their associated channel input and node N1. The mux controller 140 generates the control signals to the switches S1-S3 of the switch assemblies 111-115 to turn on or off each respective switch. The node between S1 and S2 is designated node N2. S3 of each switch assembly is coupled between node N2 and ground. When S3 is on, the respective node N2 is coupled to the ground potential. To turn a switch assembly on and thereby enable the channel, its switches S1 and S2 are turned on and its switch S3 is turned off. To turn a switch assembly off and thereby disable the channel, its switches S1 and S2 are turned off and its switch S3 is turned on. As shown in the example of FIGS. 1, S1 and S2 of switch assembly 111 are on and the corresponding switch S3 is off. S1 and S2 of the remaining four switch assemblies 112-115 are off, and their switches S3 are on. As such, channel 101 is enabled in this example, and channels 102-105 are off.

Even when a channel's switch assembly is configured to be off (its S1 and S2 are off, and its S3 is on), leakage current can still flow through S2. Leakage currents Ileak1, Ileak2, Ileak3, and Ileak4 are shown in FIG. 1 to represent the leakage current through S2 of off switch assemblies 112-115. Part of the reason for the leakage current stems from the fact that the channel that is on (channel 101 in this example) provides the voltage from its input inp1 through switch assembly 111 to node N1, and all of the switch assemblies 111-115 are coupled to node N1 as shown. Thus, the voltage on node N1 from channel 101 is also provided to one terminal of S2 of the four off switch assemblies 112-115. As the output impedance of a sensor connected to a channel input can be relatively high (e.g., hundreds of mega-ohms), even a small amount of leakage current can generate a voltage across the output impedance of that channel. The voltage due to leakage current from an off channel is additive (or subtractive depending on the direction of the leakage current) to the voltage generated by the sensor from the on channel, and thus distorts that sensor's signal.

Figure 2:
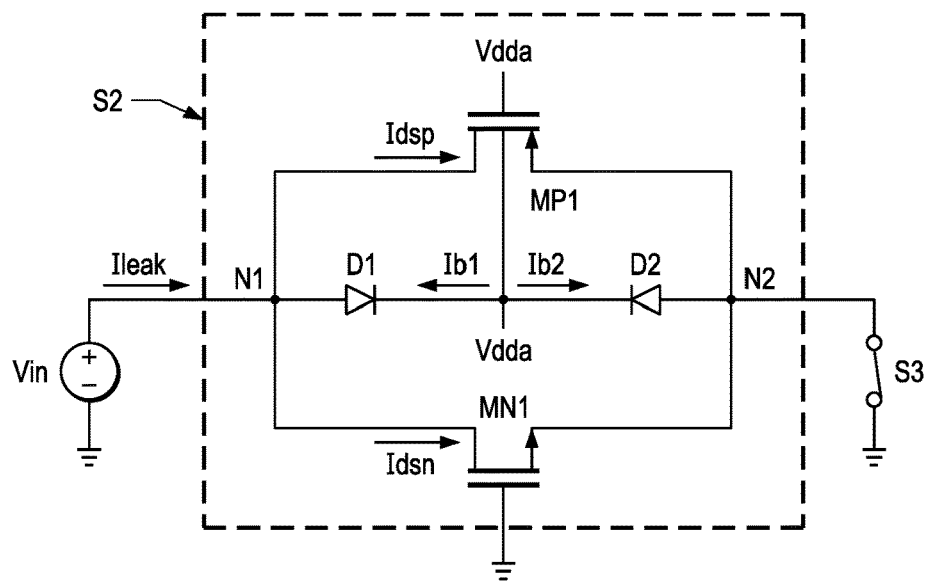
FIG. 2 shows an example implementation of a switch included within the multi-channel system.

FIG. 2 shows an example implementation of switch S2 of each of the switch assemblies 111-115. The reason for the leakage current can be identified through a discussion of FIG. 2. Referring to FIG. 2, S2 of each switch assembly 111-115 includes a p-type MOS (PMOS) transistor MP1 coupled to an n-type MOS (NMOS) transistor MN1. The drains of MP1 and MN1 are connected together at node N1, and the sources of MP1 and MN1 are connected together at node N2. The gates of MP1 and MN1 are driven by control signals to turn the transistors of S2 on and off. To turn S2 on, both MP1 and MN1 are turned on. To turn S2 off, both MP1 and MN1 are turned off. In the example configuration shown in FIG. 2, the gate of MN1 is driven by a low (e.g., ground) control signal, and the gate of MP1 is driven by a high control signal (shown as Vdda, which is a supply voltage). With the gate of MN1 driven low and the gate of MP1 driven high, both MP1 and MN1 are off. As such, FIG. 2 shows the off state for S2.

A MOS transistor has parasitic bulk diodes. FIG. 2 shows a drain-to-bulk diode D1 and a bulk-to-source diode D2 of MP1. As explained above, the voltage on node N1 is driven by the sensor whose switch assembly is on. S2 in FIG. 2 represents an S2 switch of a switch assembly that is off. The voltage labeled Vin represents the voltage on node N1 from a sensor of another channel that is on (e.g., channel 101). Node N2 of S2 in FIG. 2 receives the ground potential through S3 (which is on) of the respective switch assembly. The bulk of S2's MP1 is biased to Vdda.

Figure 6:
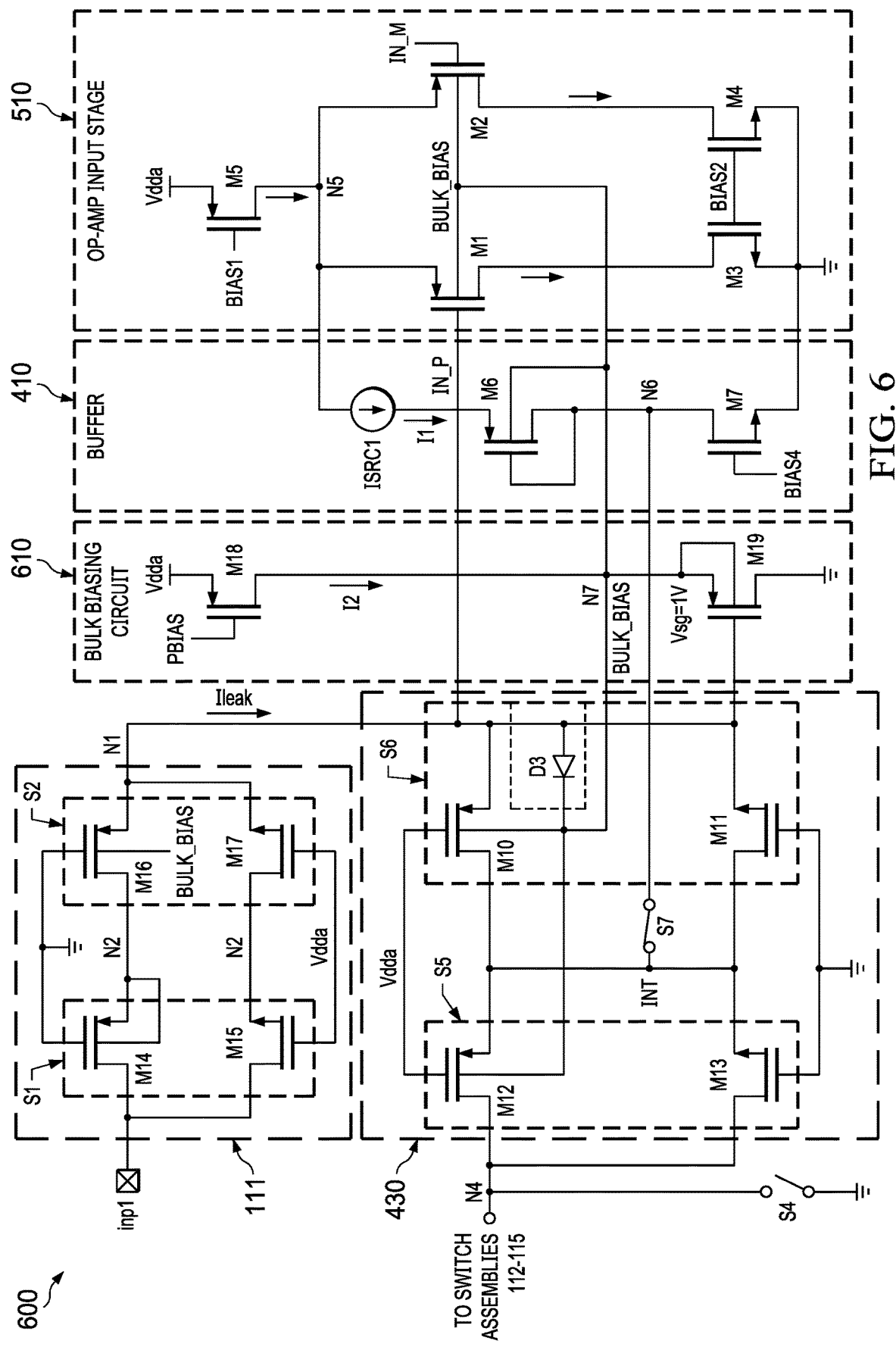
FIG. 6 shows an example of a circuit including a portion of the multi-channel system and including the buffer and a bulk biasing circuit to reduce leakage current through channels that are off.

S2 has multiple sources of leakage current when S2 is off. First, when Vin is 0 V (e.g., the voltage from the sensor coupled to the on-channel 101), D1 is reverse biased, thereby causing a current Ib1 to flow through D1. As such, the leakage current Ileak (when Vin is low, e.g. 0 V) is equal to −Ib1+Idsn (Idsn is the leakage current through MN1). However, Idsn may be substantially smaller than Ib1, and thus Ileak is approximately equal to −Ib1. Second, when Vin is higher (e.g., Vdda), Ileak is equal to the sum of the drain-to-source leakage currents of MP1 and MN1 (Idsp+Idsn). Both Idsp and Idsn are proportional to Vin (e.g., the larger is Vin, the larger will be Idsp and Idsn). Some examples described herein reduce the leakage current Ileak through S2 of the switch assemblies, when such switch assemblies are off, by the use of a buffer (e.g., buffer 310 in FIG. 3 and buffer 410 in FIG. 4) as well as a bulk biasing circuit 610 (FIG. 6)

Figure 3:
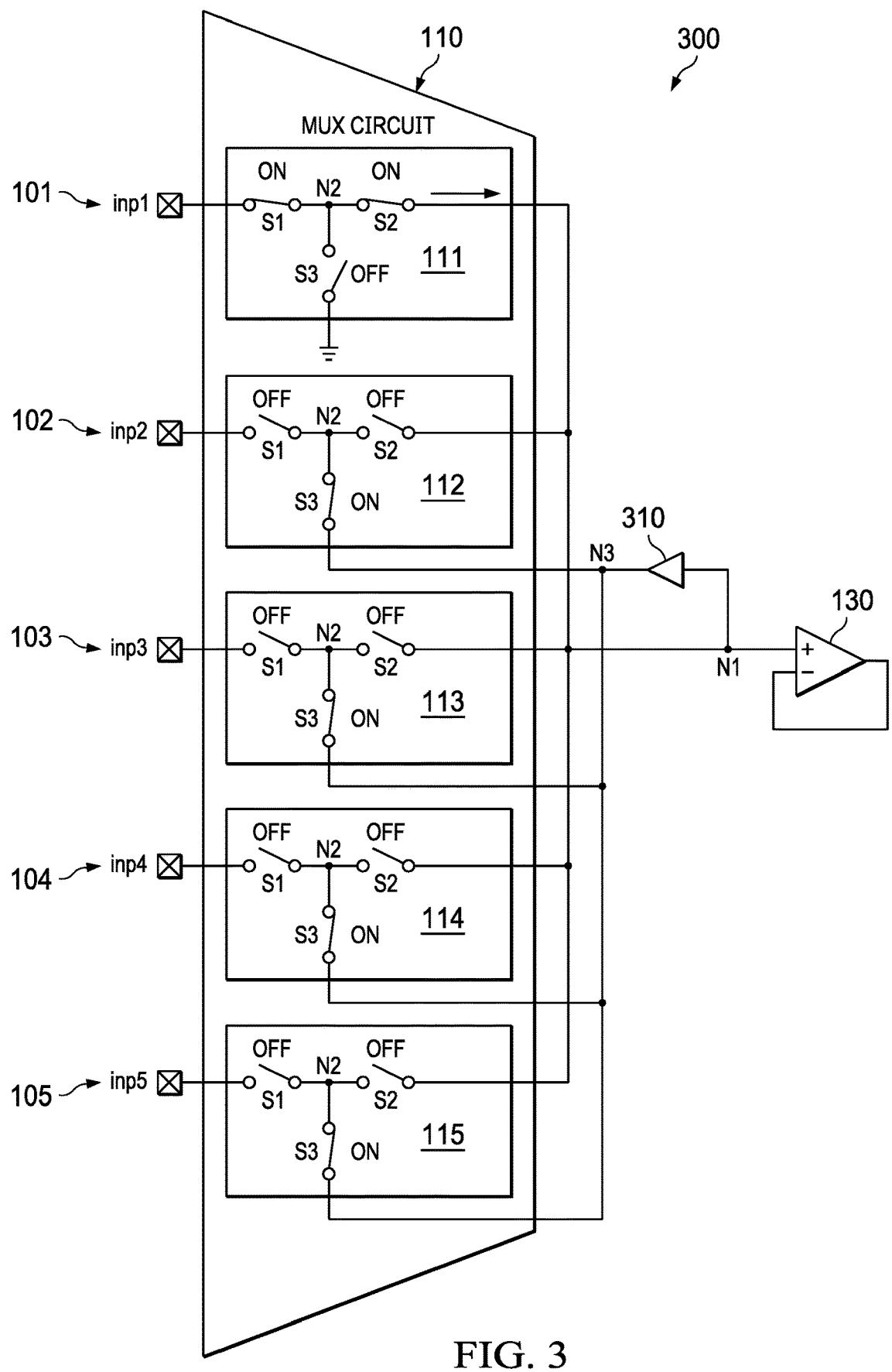
FIG. 3 illustrates another example of a multi-channel system including a buffer to reduce leakage current through channels that are off.

FIG. 3 shows an example of a system 300 including mux circuit 110, op amp 130, and a buffer 310. The sensors S1-S5, mux controller 140, and processing system 150 are not shown for simplicity. The architecture of system 300 is largely the same as that of system 100 of FIG. 1, except for the inclusion of buffer 310. In system 100 of FIG. 1, each switch S3 is coupled between its respective node N2 and ground. When S3 is on in FIG. 1, the respective node N2 is grounded. Grounding node N2 results in leakage current through the MP1 and MN1 transistors of S2 when node N1 is of a sufficiently high voltage relative to ground. Buffer 310 of FIG. 3 is coupled between node N1 and switches S3 of switch assemblies 112-115 at node N3. The buffer 310 is configured for unity gain, and thus the buffer's output voltage (node N3) is equal to its input voltage (node N1). The voltage on N1 is approximately equal to the voltage produced by the sensor whose switch assembly is on (switch assembly 111 in the example of FIG. 3). As such, the voltage on N3 also is equal to the voltage on N1.

In the example of FIG. 2, N2 is coupled to ground when S3 is turned on. By grounding N2, a large enough drain-to-source voltage develops across MP1 and MN1 to cause leakage currents Idsp and Idsn to flow through MP1 and MN1. In FIG. 3, instead of grounding N2 in switch assemblies 112-115, N2 is coupled N3, which has approximately the same voltage as on N1. As such, a much lower drain-to-source voltage (approximately 0 V) develops across MP1 and MN1 for S2 of switch assemblies 112-115. Advantageously, when channel 101 is enabled and channels 102-105 are disabled much lower leakage current results through MP1 and MN1 of S2 of switch assemblies 112-115 by the use of buffer 310 when Vin is significantly greater than 0 V (as might be caused by the use of enabled channel 101).

Because buffer 310 drives all of switches S3 of switch assemblies 112, 113, 114, and 115, buffer 310 is sized to be large enough to power all four switches S3 of switch assemblies 112, 113, 114, and 115.

Figure 4:
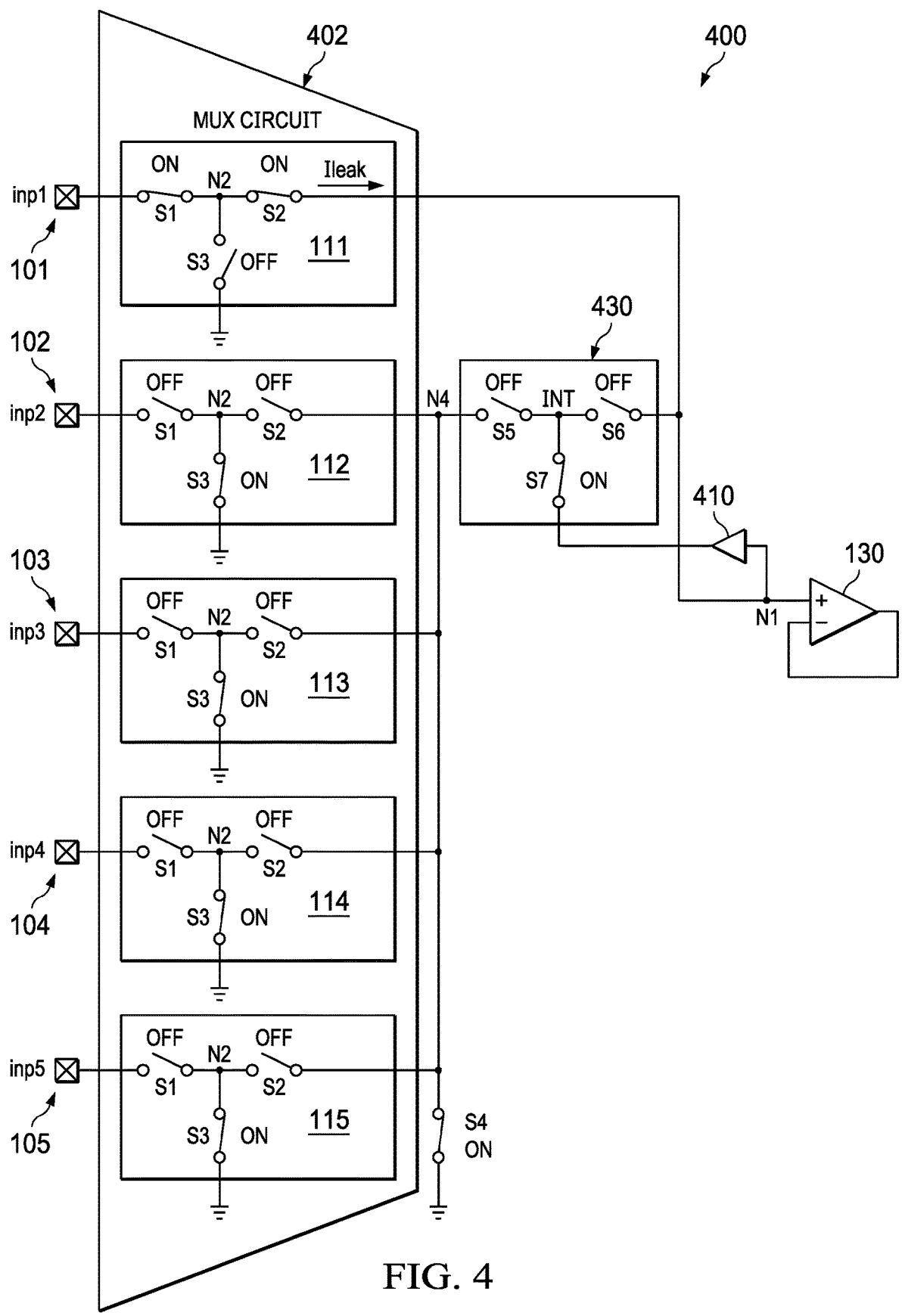
FIG. 4 illustrates another example of a multi-channel system including a buffer to reduce leakage current through channels that are off.

FIG. 4 shows an example system 400 including a mux circuit 402, op amp 130, buffer 410, switch assembly 430, and switch S4. The sensors S1-S5, mux controller 140, and processing system 150 are not shown for simplicity. Mux circuit 402 has an architecture similar to that of mux circuit 110 described above. Mux circuit 402 includes switch assemblies 111-115. The node interconnecting all switches S2 of switch assemblies 112-115 is labeled N4 in FIG. 4. Switch assembly 430 is coupled between node N4 and the output of buffer 410. Switch assembly 430 has a similar architecture as that of switch assemblies 111-115. Switch assembly 430 includes switches S5, S6, and S7 as shown. Switches S5 and S6 are coupled in series between nodes N1 and N4. The node between S5 and S6 is designated the intermediate node (INT). S7 is coupled between INT and the output of buffer 410.

Buffer 410 generates an output voltage which is approximately equal to its input voltage (voltage on node N1). Buffer 410 in FIG. 4 drives switch assembly 430, rather than directly driving switch assemblies 112-115. As a result of driving one switch assembly 430, buffer 410 can have a lower output current requirement and thus be smaller than buffer 310 of FIG. 3.

When switch assembly 111 is to be on (as is the case in the example of FIG. 4), switch assemblies 112-115 and 430 are turned off, and switch S4 is turned on. S4 is coupled between node N4 and ground. By turning S4 on, node N4 is grounded. Little or no leakage current flows through switch assemblies 112-115 as well as 430 when switch assembly 111 is enabled and switch assemblies 112-115, 430 are off. Buffer 410 provides the same benefit to switch assembly 430 to reduce its leakage current as described above regarding buffer 310. If any of inputs inp2-inp4 are to be used, then the switch assembly of that particular input is turned on, and the remaining switch assemblies from among switch assemblies 111-115 as well as S4 are turned off and switch assembly 430 is turned on.

Figure 5:
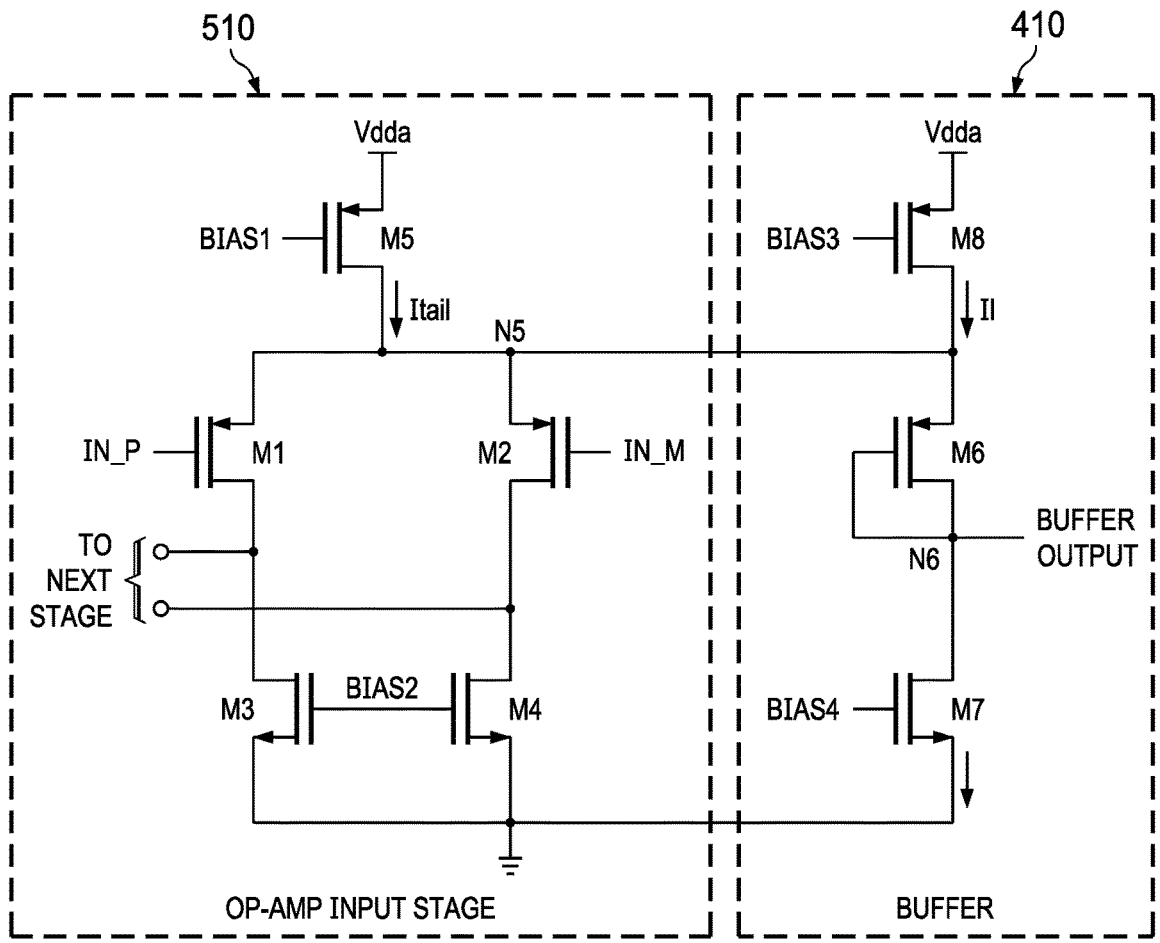
FIG. 5 shows an example implementation of the buffer.

FIG. 5 shows an example implementation of buffer 410 (or 310) coupled to an input stage 510 of op amp 130. The input stage 510 includes transistors M1-M5. In this example input stage, M1, M2, and M5 are PMOS transistors, and M3 and M4 are NMOS transistors. M5 is a current source device, whose gate is biased at a voltage labeled BIAS1 and produces a tail current, Itail. M1 and M2 comprise a differential transistor pair. The sources of M1 and M2 are connected together and to the drain of M5. The positive (+) input of op amp 130 is coupled to the gate of M1 and is designated IN_P. The negative (−) input of op amp 130 is coupled to the gate of M2 and is designated IN_M. The gates of transistors M3 and M4 are biased at a voltage labeled BIAS2.

The buffer 410 comprises transistors M6, M7, and M8. M6 and M8 in this example comprise PMOS transistors, and M7 comprises an NMOS transistor. The gate of M8 is biased a voltage labeled BIAS3, and the source of M8 is connected to the supply voltage, Vdda. In one example, BIAS3 equals BIAS1. The drain of M8 is connected to the source of M6 and to node N5. As such, the M8 drain and M6 source are connected to the op amp input stage 510 at node N5. The drains of M6 and M7 are connected together and to the gate of M6 at node N6. Node N6 represents the output of the buffer 410, which is connected to node N3 in FIG. 3 and, in the case of buffer 410, to switch S3 of switch assembly 430 in FIG. 4. The gate of M7 is biased at a voltage labeled BIAS4, and the source of M7 is connected to ground. In one example, BIAS4 equals BIAS2.

The current through M8 is labeled I1. Current I1 is a function, in part, of the size of M8 (ratio of its channel width (W) to channel length (L)) and the gate-to-source voltage (Vgs) of M8. The source of M8 is tied to Vdda, and the gate of M8 is BIAS3. As such, BIAS3 and the ratio of channel width to length of M8 define the magnitude of current I1. If BIAS3 equals BIAS1, I1 will be one-sixteenth Itail if W/L of M8 is one-sixteenth W/L of M5. In one example, BIAS3 and the channel width to length ratio of M8 result in a magnitude of I1 that is one-sixteenth the magnitude of Itail, and that fraction can be different than one-sixteenth in other examples. Further, the ratio of channel width to length of M6 is one-eighth the size of the ratio of channel width to length of M1 or M2 (which are themselves of equal size). The sources of M1, M2, and M6 are connected together at node N5. The current density through M6 is the same as that of M1 and M2. That is, while I1 through M6 is Itail/16, W/L of M6 is one-eighth the W/L of M1 or M2. Due to the output of the op amp 130 being connected to its negative input (IN_M) as shown in FIG. 4, IN_P remains generally equal to IN_M. Because the source voltage of M6 is equal to the source voltage of M1 and M2, and the current densities are the same, the gate voltage of M6 will be equal to the gate voltages IN_P or IN_M of M1 and M2, respectively. As such, the output voltage of buffer 410 on node N6 will be approximately equal to IN_P.

As explained above regarding FIG. 2, when Vin is a relatively low voltage, if the bulk of the MP1 transistor is biased at the supply voltage (Vdda), the drain-to-bulk parasitic diode D1 of switches S2 of the switch assemblies 112-115 are reversed biased, thereby causing a leakage current to flow through each such switch S2.

FIG. 6 shows a system 600 in which the bulk of the PMOS transistors of the switches S2 is biased at a voltage lower than Vdda when Vin is a low voltage.

The example system 600 in FIG. 6 includes the input stage 510 of op amp 130, the buffer 410, a bulk biasing circuit 610, switches S1, S2, and S4, and switch assembly 430. ISRC1 in buffer 410 represents M8 in FIG. 5. In this example, switch S6 of switch assembly 430 comprises transistors M10 and M11. Further, switch S5 comprises transistors M12 and M13. Switch assembly 430 is shown in its off state, and thus switch S7 is on. S7 is shown in its symbolic form. In some implementations, S7 comprises a single transistor or a pair of PMOS/NMOS transistors. M10 and M12 comprise PMOS transistors, and M11 and M13 comprise NMOS transistors. The sources of M10 and M11 are connected together, and connect to the IN_P input (gate of M1) of the op amp's input stage 510. The drains of M10 and M11 are connected together at node INT. S7 is shown in its closed (on) state to couple INT to the output of the buffer 410 (node N6). The sources of M12 and M13 are also connected to INT. The drains of M12 and M13 are connected together at node N4, which is provided to the switch assemblies 112-115 as shown in FIG. 4. Switch S4 is coupled between node N4 and ground, and is closed (on) when switch assembly 430 is off. When switch assembly 430 is off, S5 and S6 are off. For S5 and S6 to be off, the gates of PMOS transistors M10 and M12 are provided with the supply voltage (Vdda) as shown, and NMOS transistors M11 and M13 are provided with a ground voltage as shown.

S1 comprises transistors M14 and M15, and S2 comprises transistors M16 and M17. In this example, M14 and M16 comprise PMOS transistors, and M15 and M17 comprise NMOS transistors. The drains of M15 and M16 are connected together at the input inp1 of channel 101. The sources of M16 and M17 are connected together at node N1 to which the gate of M1 within the op amp's input stage 510 is connected. The configuration of FIG. 6 illustrates switch assembly 111 in its on state, and thus the gates of PMOS transistors M14 and M16 are grounded to turn on M14 and M16, and the gates of NMOS transistors M15 and M17 receive the supply voltage, Vdda, to turn on M15 and M17. Further, switch S3 (FIG. 4) of switch assembly 111 is turned off, and thus node N2 is not pulled to ground. S3 is not shown in FIG. 5.

Example bulk biasing circuit 610 includes transistors M18 and M19. In this implementation, M18 and M19 are PMOS transistors. The source of M18 is connected to Vdda, and the drain of M18 is connected to the source of M19 at node N7. The drain of M19 is connected to ground. The bulk of M19 is connected to M19's source. With M19 configured as a source-follower, current I2 flows in the branch from Vdda through M18 and M19 to ground. The voltage on the source of M19 is one threshold voltage (approximately 1 V) above the gate voltage of M19. The signal on the gate of M19 is the voltage on node N1. The voltage on N1 will be low when switch assembly 111 is on (S1 and S2 are on) and the voltage on inp1 is low, Current I2 flows through M19 resulting in the voltage on the source of M19 being approximately 1 V greater than its gate voltage (N1). Node N7 is coupled to the bulks of M1 and M2 within the op amp's input stage and to the bulk of M10 within switch S6, as well as the bulk of M16 of S2 within switch assembly 111. The corresponding bulk of PMOS transistor of S2 of the other switch assemblies 112-115 also may be coupled to node N7 as well. The voltage on node N7 is used to bias the bulks of M1 M2, and M10. When the input inp1 is low enough so as to turn on M10, the voltage on node N7 will be pulled down to approximately 1 V above the voltage on inp1, and thus the bulks of M1, M2, and M10 are biased to a voltage much lower than Vdda (e.g., 1 V). With the bulk of M10 biased to a voltage substantially lower than Vdda, the bulk-to-source parasitic diode D3 of M10 will be biased with a voltage much closer to 0 V than if the bulk of M10 were biased to Vdda. With D3 biased to 0 V, or a relatively small voltage, the leakage current through D3 will be much smaller than would be the case if D3 were biased by a larger voltage. By biasing the bulk of PMOS M10 within switch assembly 430 to a lower voltage when the voltage on inp1 is small (than when inp1 has a larger voltage), the leakage current through switch assembly 430 is reduced compared to persistently biasing the bulk of M10 at Vdda.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

What is claimed is:

1. A circuit comprising:
   a plurality of inputs;
   a plurality of switch assemblies including a first switch assembly, a second switch assembly, and a third switch assembly; and
   a buffer including an input and an output,
   wherein:
      each of the plurality of switch assemblies includes:
         a first switch coupled between a respective input of the plurality of inputs and an internal node;
         a second switch coupled to the internal node; and
         a third switch directly coupled to the internal node;
      the input of the buffer is coupled to the respective second switches of the first, second, and third switch assemblies;
      and
      the output of the buffer is coupled to the respective third switches of the second and third switch assemblies instead of the first switch assembly.

2. The circuit of claim 1, wherein the respective third switch of the first switch assembly is coupled to a ground node.

3. The circuit of claim 1, wherein the buffer comprises a unity gain buffer.

4. The circuit of claim 1, further comprising an operational amplifier that includes:
   a first input coupled to the second switch of each of the plurality of switch assemblies;
   a second input; and
   an output.

5. The circuit of claim 4, wherein the output of the operational amplifier is coupled to the second input of the operational amplifier.

6. The circuit of claim 4, wherein the operation amplifier is configured as a unity gain buffer.

7. The circuit of claim 1, wherein the plurality of switch assemblies are configured as a multiplexer.

8. The circuit of claim 7, further comprising a multiplexer controller coupled to the respective first, second, and third switches of each of the plurality of switch assemblies.

9. A circuit comprising:
   a plurality of inputs;
   a multiplexer output node;
   a plurality of switch assemblies including a first switch assembly, a second switch assembly, and a third switch assembly; and
   a buffer including an input and an output,
   wherein:
      each of the plurality of switch assemblies includes:
         a first switch coupled between a respective input of the plurality of inputs and an internal node;
         a second switch coupled between the internal node and the multiplexer output node; and
         a third switch directly coupled to the internal node;
      the input of the buffer is coupled to the respective second switches of the first, second, and third switch assemblies; and
      the output of the buffer is coupled to the respective third switches of the second and third switch assemblies instead of the first switch assembly.

10. The circuit of claim 9, wherein the buffer comprises a unity gain buffer.

11. The circuit of claim 9, further comprising an operational amplifier that includes:
    a first input coupled to the multiplexer output node;
    a second input; and
    an output.

12. The circuit of claim 11, wherein the output of the operational amplifier is coupled to the second input of the operational amplifier.

13. The circuit of claim 11, wherein the operational amplifier is configured as a unity gain buffer.

14. The circuit of claim 9, wherein the plurality of switch assemblies are configured as a multiplexer.

15. The circuit of claim 9, further comprising a multiplexer controller coupled to the respective first, second, and third switches of each of the plurality of switch assemblies.

16. A circuit comprising:
    a plurality of inputs;
    a plurality of switch assemblies including a first switch assembly, a second switch assembly, and a third switch assembly; and
    a buffer including an input and an output,
    wherein:
        each of the plurality of switch assemblies includes:
            a first switch coupled between a respective input of the plurality of inputs and an internal node;
            a second switch coupled to the internal node; and
            a third switch coupled to the internal node;
        the input of the buffer is coupled to the respective second switches of the first, second, and third switch assemblies;
        and
        the output of the buffer is coupled to the respective third switches of the second and third switch assemblies instead of the first switch assembly; and
    an operational amplifier having a first input coupled to the respective second switch of each of the plurality of switch assemblies, a second input, and an output coupled to the second input.

17. The circuit of claim 16, wherein the buffer comprises a unity gain buffer.

18. The circuit of claim 16, wherein the respective first switch of each of the plurality switch assemblies is directly coupled to the respective input of the plurality of inputs.

* * * * *